US012031921B2

(12) United States Patent
Okuta et al.

(10) Patent No.: US 12,031,921 B2
(45) Date of Patent: Jul. 9, 2024

(54) MEASUREMENT SYSTEM

(71) Applicant: Kabushiki Kaisha Nihon Micronics, Tokyo (JP)

(72) Inventors: Michitaka Okuta, Tokyo (JP); Yuki Saito, Tokyo (JP); Hisao Narita, Aomori (JP); Shou Harako, Aomori (JP); Jukiya Fukushi, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 114 days.

(21) Appl. No.: 17/097,900

(22) Filed: Nov. 13, 2020

(65) Prior Publication Data

US 2021/0148835 A1 May 20, 2021

(30) Foreign Application Priority Data

Nov. 18, 2019 (JP) .................................. 2019-207851

(51) Int. Cl.
*G01N 21/954* (2006.01)

(52) U.S. Cl.
CPC ... *G01N 21/954* (2013.01); *G01N 2021/9546* (2013.01)

(58) Field of Classification Search
CPC ....... G01N 21/954; G01N 2021/95638; G01N 21/9501; G01N 21/17; G01R 1/073
See application file for complete search history.

(56) References Cited

U.S. PATENT DOCUMENTS

2015/0253388 A1  9/2015 Masuda et al.
2019/0331592 A1* 10/2019 Dighe ................ G01B 11/0616

FOREIGN PATENT DOCUMENTS

| CN | 101770967 A | 7/2010 |
| CN | 104898037 A | 9/2015 |
| JP | S6064443 A | 4/1985 |
| JP | S6231136 A | 2/1987 |
| KR | 20110129283 | * 12/2011 |
| WO | WO-2020255190 A1 | * 12/2020 |

* cited by examiner

*Primary Examiner* — Rebecca C Bryant
(74) *Attorney, Agent, or Firm* — LKGlobal | Lorenz & Kopf, LLP

(57) ABSTRACT

A measurement system includes an optical probe array including the m-number of optical probe groups arranged, each including the n-number of optical probes, the m-number of optical signal selectors each corresponding one of the optical probe groups, and a control circuit configured to control the optical signal selectors. The respective optical signal selectors select and output one of optical signals output from the n-number of the optical probes of the corresponding optical probe groups. The measurement system causes the control circuit to control the optical signal selectors to repeat the selection of the optical signals until the optical signals output from all of the optical probes included in the respective optical probe groups are selected.

4 Claims, 8 Drawing Sheets

MEASUREMENT SYSTEM

CROSS-REFERENCE TO PRIORITY APPLICATION

This application is based upon and claims the benefit of priority from prior Japanese Patent Application 2019-207851, filed on Nov. 18, 2019; the entire contents of which are incorporated by reference herein.

TECHNICAL FIELD

Embodiments described herein relate generally to a measurement system used for measuring the properties of optical semiconductor elements.

BACKGROUND

Optical semiconductor elements using electric signals and optical signals as input/output signals are formed on a semiconductor substrate by silicon photonics. Connecting the optical semiconductor elements with a measurement device such as a tester is effective for measuring the properties of the optical semiconductor elements formed on the semiconductor substrate by use of a measurement system including electric probes through which the electric signals are transmitted and optical probes through which the optical signals are transmitted.

For example, the electric probes including conductive material and the optical probes including optical fibers or a combination of lenses and optical fibers are used for the measurement of the optical semiconductor elements.

For example, a method of inputting the electric signals by the electric probes to drive the optical semiconductor elements so as to receive the optical signals output from the driven optical semiconductor elements by the optical probes is used for measuring the properties of the optical semiconductor elements formed on the semiconductor substrate. This measurement method uses a measurement system in which the number of each of the electric probes and the optical probes correspond to the number of the optical semiconductor elements. Measuring thousands of or several tens of thousands of optical semiconductor elements formed on the semiconductor substrate individually by this measurement system is not practical because it would take a quite long time for the measurement. If all of the optical semiconductor elements formed on the semiconductor substrate could not be measured, the determination of whether each element is well-made or defective cannot be sufficiently made, reducing the yield on products.

BRIEF SUMMARY

An aspect of one or more embodiments provides a measurement system including an optical probe array including the m-number of optical probe groups arranged, each including the n-number of optical probes, where n and m are each an integer of two or greater, the m-number of optical signal selectors each corresponding to one of the optical probe groups to select and output one of optical signals output from the n-number of the optical probes of the corresponding optical probe groups, and a control circuit configured to control the optical signal selectors. The measurement system causes the control circuit to control the optical signal selectors to repeat a selection of the optical signals until the optical signals output from all of the optical probes included in the respective optical probe groups are selected.

DETAILED DESCRIPTION

Figure 1:
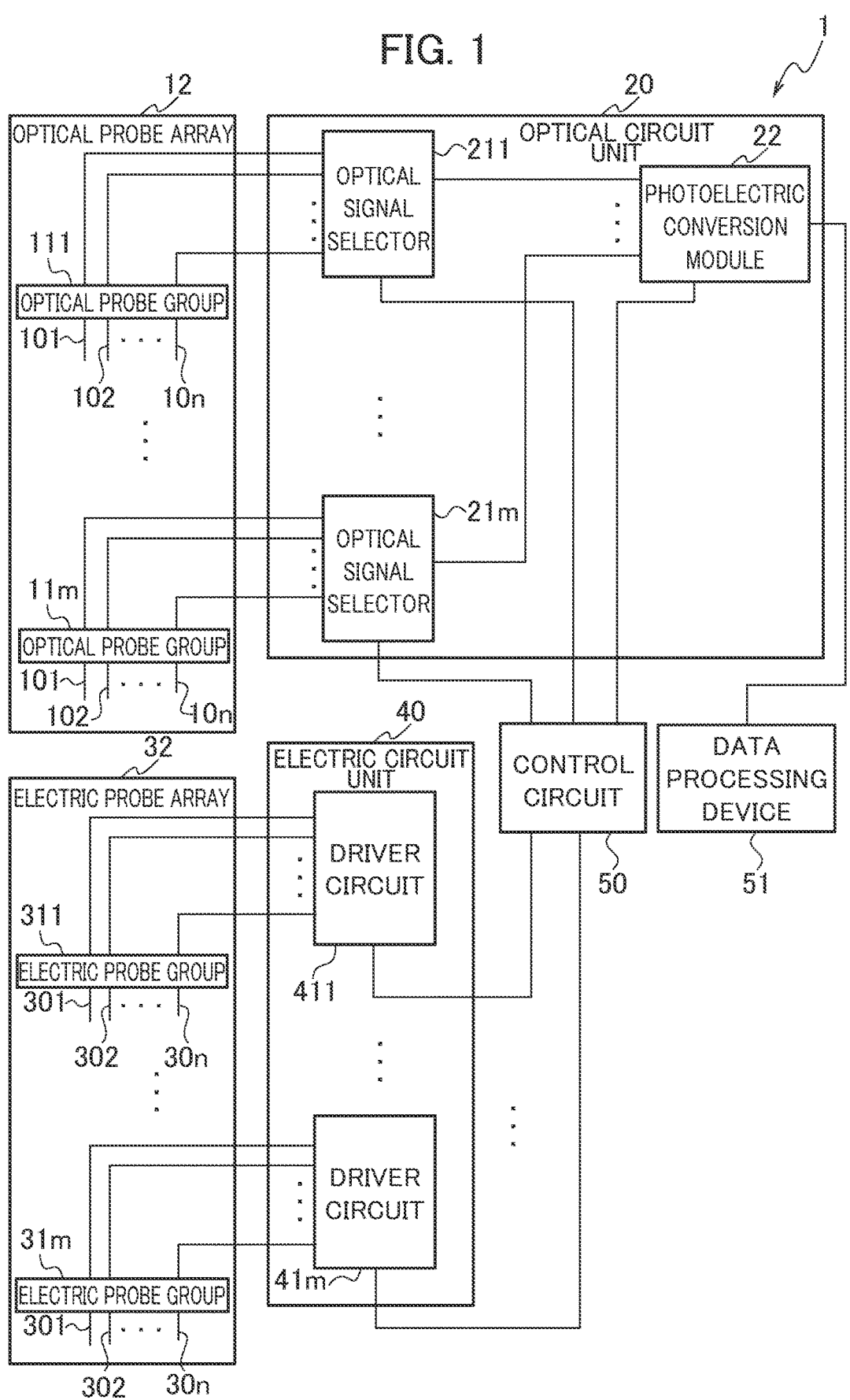
FIG. 1 is a schematic view showing a configuration of a measurement system according to a first embodiment.

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this invention, and the embodiments of this invention do not specify materials, shapes, structures, dispositions and the like of constituent components to those described below.

First Embodiment

A measurement system 1 according to a first embodiment of the present invention includes, as illustrated in FIG. 1, an optical probe array 12 in which an optical probe group 111 to an optical probe group 11m are arranged, and an optical circuit unit 20 including an optical signal selector 211 to an optical signal selector 21m (m is an integer of two or greater). The optical probe groups 111 to 11m are herein also collectively referred to below as "optical probe groups 11. The optical signal selectors 211 to 21m are herein also collectively referred to below as "optical signal selectors 21". The measurement system 1 includes the m-number of the optical probe groups 11 and the m-number of the optical signal selectors 21. A control circuit 50 controls the operation of the respective optical signal selectors 21.

Each of the optical probe groups 11 includes an optical probe 101 to an optical probe 10n (n is an integer of two or greater). The optical probes 101 to 10n are herein also collectively referred to below as "optical probes 10". The optical probe array 12 includes the "n×m" number of the optical probes 10. The optical probes 10 may employ optical fibers or a combination of optical fibers and lenses. For example, the optical probe array 12 may be configured such that the m-number of the optical probe groups 11, each including the n-core optical fibers aligned in line, are used and arranged so that the "n×m" number of the optical probes 10 are arranged into a matrix form.

Each of the optical signal selectors 21 corresponds to one of the optical probe groups 11. Each optical signal selector 21 selects and outputs one of optical signals output from the n-number of the optical probes 10 of the corresponding optical probe group 11. For example, the optical signal selector 21i corresponding to the optical probe group 11i selects one of the optical signals output from the optical probes 10 of the optical probe group 11i ($1 \le i \le m$).

The optical signal selector 21 uses an optical switch including the n-number of input channels for the first channel to which the optical signal is input from the optical probe 101 to the n-th channel to which the optical signal is input from the optical probe 10n. The optical signal selector 21 then outputs, from an output terminal, one optical signal selected from the optical signals input through the n-number of the input channels. The determination of which optical signal the optical signal selector 21 selects is made by the control circuit 50. As described in detail below, the measurement system 1 causes the control circuit 50 to control the optical signal selector 21 to repeat switching the optical signal selection until the optical signals output from all of the optical probes 10 included in the corresponding optical probe group 11 are selected.

The measurement system 1 also includes an electric probe array 32 in which an electric probe group 311 to an electric probe group 32m are arranged, and an electric circuit unit 40 including a driver circuit 411 to a driver circuit 41m. The electric probe groups 311 to 31m are herein also collectively referred to below as "electric probe groups 31". The driver circuits 411 to 41m are herein also collectively referred to below as "driver circuits 41". The measurement system 1 includes the m-number of the electric probe groups 31 and the m-number of the driver circuits 41.

Each of the electric probe groups 31 is arranged to correspond to one of the optical probe groups 11. Each electric probe group 31 includes an electric probe 301 to an electric probe 30n each being paired with one of the optical probes 10 of the corresponding optical probe group 11. The electric probes 301 to 30n are herein also collectively referred to below as "electric probes 30". As described in detail below, the pair of the optical probe 10 and the electric probe 30 implements a probe unit. The single probe unit is prepared for a single measurement target 100. The number of the electric probe 30 included in the probe unit is not limited to one, but this embodiment is illustrated below with the case in which the probe unit includes the single electric probe 30.

As described above, the electric probe groups 31 each include the n-number of the electric probes 30. The electric probe array 32 thus includes the "n×m" number of the electric probes 30. A material used for the electric probes 30 is a conductive material such as metal. The electric probes 30 used may be a cantilever type, a vertical needle type, or a vertical spring type, for example.

Each of the driver circuits 41 corresponds to one of the electric probe groups 31. Each driver circuit 41 supplies electric signals to the electric probes 30 included in the corresponding electric probe group 31. For example, the driver circuit 41i corresponding to the electric probe group 31i supplies the electric signal to any of the electric probes 30 in the electric probe group 31i ($1 \le i \le m$). The control circuit 50 controls the operation of the respective driver circuits 41. The electric probes 30 to which the electric signals are supplied from the corresponding driver circuit 41 may be determined as appropriate. For example, the driver circuit 41 may supply the electric signals simultaneously to all of the electric probes 30 included in the corresponding electric probe group 31. Alternatively, the driver circuit 41 may selectively supply the electric signals to some of the electric probes 30 included in the corresponding electric probe group 31. The determination of which electric probes 30 in the electric probe group 31 the driver circuit 41 supplies the electric signals to is made by the control circuit 50.

The optical circuit unit 20 of the measurement system 1 includes a photoelectric conversion module 22 which converts the optical signals output from the m-number of the optical signal selectors 21 into the electric signals, and selects and outputs one of the converted electric signals. The photoelectric conversion module 22 includes the m-number of input channels and a single output terminal. The optical circuit unit 20 has optical-signal transfer paths which are optical waveguide paths such as optical fibers. For example, the respective optical signal selectors 21 are connected to the photoelectric conversion module 22 via the optical fibers. The respective optical signal selectors 21 are connected to the optical probes 10 of the corresponding optical probe groups 11 via the optical fibers.

For example, the photoelectric conversion module 22 includes the m-number of photoelectric converters each corresponding to one of the optical signal selectors 21. Each photoelectric converter converts the optical signal output from the corresponding optical signal selector 21 into the electric signal and output it. The photoelectric conversion module 22 selects and outputs one of the electric signals output from the m-number of the photoelectric converters. The control circuit 50 controls the operation of the photoelectric conversion module 22. The control circuit 50 controls the photoelectric conversion module 22 to sequentially output the electric signals converted from the optical signals output from the m-number of the optical signal selectors 21.

The measurement system 1 includes a data processing device 51 for storing measurement data output from the photoelectric conversion module 22. The data processing device 51 may have a function of processing the measurement data output from the photoelectric conversion module 22 to store the processed data.

Figure 2:
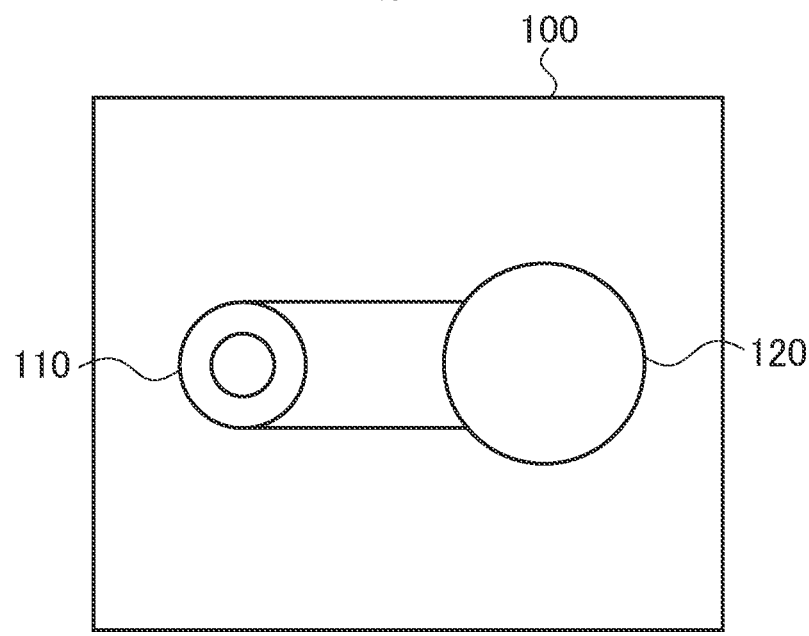
FIG. 2 is a schematic plan view showing a configuration example of a target to be measured.

The measurement target is an optical semiconductor element such as a vertical cavity surface emitting laser (VCSEL). For example, as shown in FIG. 2, the measurement target 100 includes an optical semiconductor element 110 serving as an emitting member and an electric signal terminal 120. The optical probe 10 and the optical semiconductor element 110 are optically connected to each other, and the electric probe 30 and the electric signal terminal 120 are electrically connected to each other for the measurement of the measurement target 100. The phrase "optically connected" as used herein encompasses a concept including a connection of direct contact and a connection in which light is transmitted between separated regions. For example, the optical signal output from the measurement target 100 in response to the electric signal input via the electric probe 30 is received by the optical probe 10.

Figure 3:
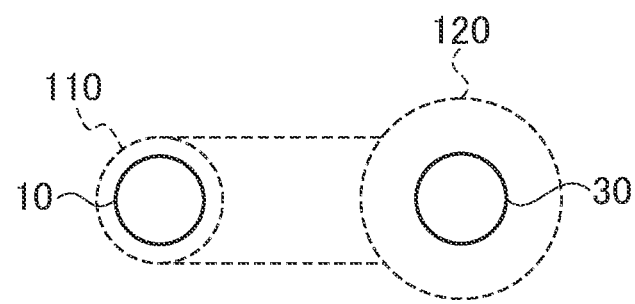
FIG. 3 is a schematic plan view showing an example of a relative positional relation between an optical probe and an electric probe in the measurement system according to the first embodiment.

A relative positional relation between a tip of the optical probe 10 optically connected to the optical semiconductor element 110 and a tip of the electric probe 30 connected to the electric signal terminal 120 corresponds to a relative positional relation between the optical semiconductor element 110 and the electric signal terminal 120. FIG. 3 illustrates the relative positional relation between the tip of the optical probe 10 and the tip of the electric probe 30 for the measurement target 100 shown in FIG. 2.

As shown in FIG. 3, the pair of the optical probe 10 and the electric probe 30 implements the single probe unit for the single measurement target 100. The control circuit 50 controls the respective optical signal selectors 21 and the respective driver circuits 41 so that the optical probe 10 and the electric probe 30 implementing the same probe unit operate together. Namely, the electric probe 30 to which the driver circuit 41 supplies the electric signal and the optical probe 10 connected to the input channel through which the optical signal selector 21 outputs the optical signal, implement the single probe unit.

FIG. 3 illustrates the case in which the number of the optical probe 10 and the number of the electric probe 30 implementing the single probe unit are each one. The number of the optical probe 10 and the number of the electric probe 30 implementing the single probe unit may be determined as appropriate depending on the configuration of the measurement target 100 and the measurement contents. For example, when the measurement target 100 includes a ground terminal, the number of the electric probe 30 implementing the probe unit is increased to two. One of the two electric probes 30 is then connected to the electric signal terminal 120 of the measurement target 100, and the other one is connected to the ground terminal of the measurement target 100.

Figure 4:
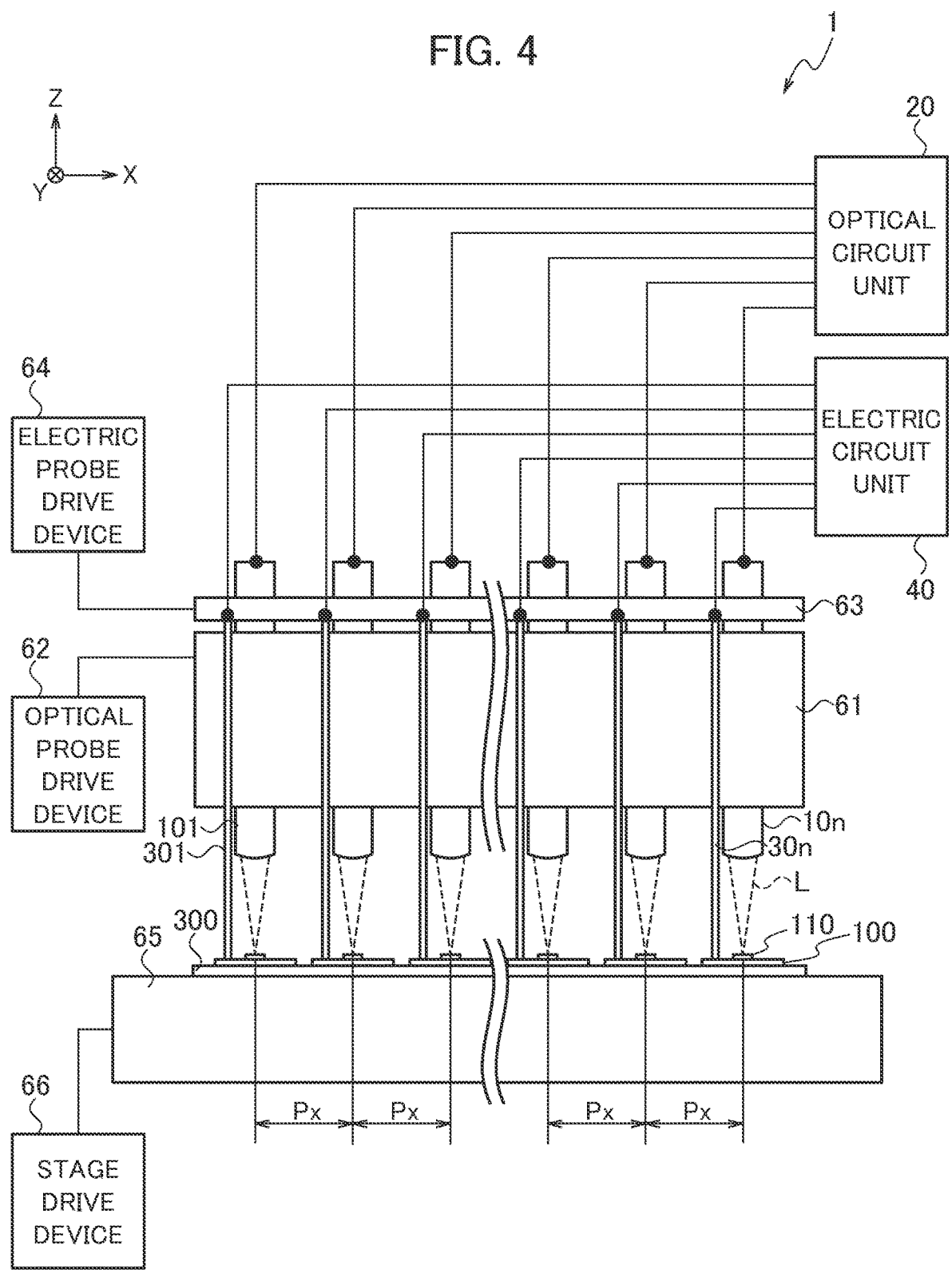
FIG. 4 is a schematic view showing a method of measuring measurement targets by use of the measurement system according to the first embodiment.

FIG. 4 illustrates an example of a method of measuring the measurement targets 100 by use of the measurement system 1. The optical probes 10 and the electric probes 30 are arranged, in a Z-axis direction in FIG. 4, over the semiconductor substrate 300 provided with the measurement targets 100. FIG. 4 defines the plane perpendicular to the Z-axis direction as an X-Y plane, the right-left direction of the sheet is defined as an X-axis direction, and the direction perpendicular to the sheet is defined as a Y-axis direction. FIG. 4 omits the illustration of the control circuit 50 and the data processing device 51.

The semiconductor substrate 300 is a gallium arsenide (GaAs) substrate or a silicon (Si) substrate, for example. The plural measurement targets 100 are arranged and set in array at regular intervals on the main surface of the semiconductor substrate 300 mounted on a stage 65 as viewed in the Z-axis direction. The interval between the respective measurement targets 100 provided on the semiconductor substrate 300 in the X-axis direction is defined as a pitch Px, and the interval in the Y-axis direction is defined as a pitch Py.

Figure 5:
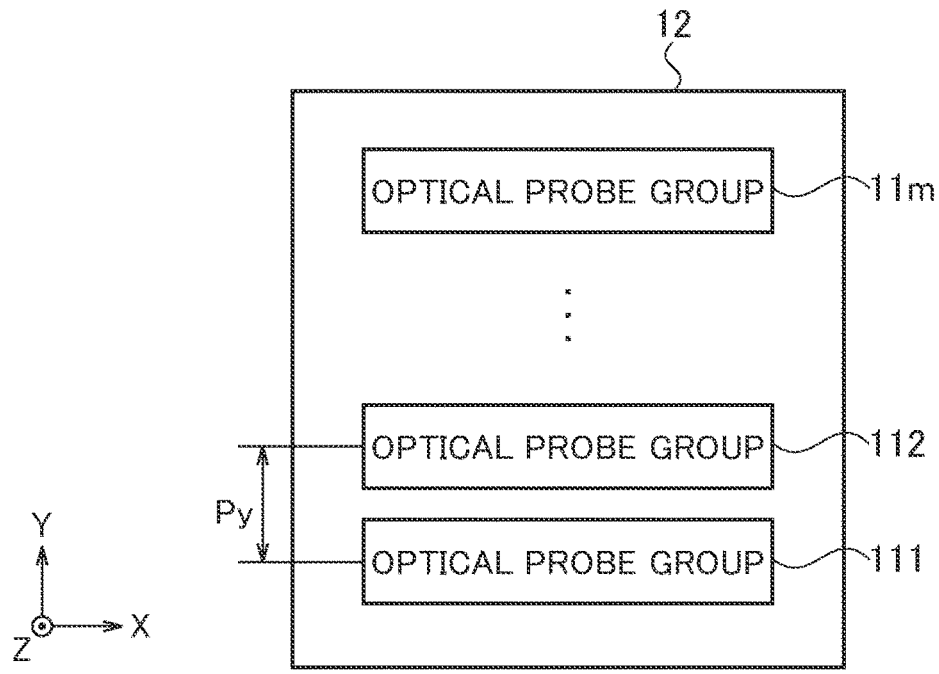
FIG. 5 is a schematic plan view showing a configuration example of an optical probe array in the measurement system according to the first embodiment.

The measurement system 1 illustrated in FIG. 4 includes an optical probe head 61 holding the optical probe array 12, and an electric probe head 63 holding the electric probe array 32. As illustrated in FIG. 4, the optical probe head 61 holds the optical probe array 12 such that the optical probes 101 to 10n of the respective optical probe groups 11 are aligned in the X-axis direction. As illustrated in FIG. 5, the optical probe groups 111 to 11m are arranged in the Y-axis direction at the pitch Py so as to compose the optical probe array 12.

The optical probe head 61 holds the optical probe array 12 in which the "m×n" number of the optical probes 10 are arranged and set in array. The electric probe head 63 holds the electric probe array 32 in which the electric probes 30 each paired with the corresponding optical probe 10 to implement the probe unit are arranged and set in array. The optical probes 10 and the electric probes 30 are arranged at regular intervals of the pitch Px in the X-axis direction and arranged at regular intervals of the pitch Py in the Y-axis direction.

The optical probe head 61 moves in the Z-axis direction in accordance with the control by an optical probe drive device 62. This control enables fine adjustments to the distance between the tips of the optical probes 10 and the measurement targets 100 in the Z-axis direction. The electric probe head 63 moves in the Z-axis direction in accordance with the control by an electric probe drive device 64. This control enables fine adjustments to the distance between the tips of the electric probes 30 and the measurement targets 100 in the Z-axis direction.

The alignment of the optical probe head 61 and the electric probe head 63 with the measurement targets 100 in the X-axis direction and the Y-axis direction can be made by the movement of the stage 65 by a stage drive device 66, for example. Rotating the stage 65 about the Z-axis as a central axis by the stage drive device 66 can adjust the positions of the optical probes 10 and the electric probes 30 with respect to the measurement targets 100 in the rotating direction about the Z-axis as a central axis (referred to below as a "Z-axis rotating direction").

Alternatively, the optical probe head 61 and the electric probe head 63 may be moved in the X-axis direction, the Y-axis direction, and the Z-axis direction while the position of the stage 65 is fixed. In other words, the optical probe drive device 62 and the electric probe drive device 64 may adjust the relative positions of the optical probes 10 and the electric probes 30 with respect to the measurement targets 100.

As described above, the alignment of the optical probes 10 and the electric probes 30 with respect to the measurement targets 100 can be available. The measurement system 1 may be configured to independently control the position of the optical probe head 61 and the position of the electric probe head 63. Alternatively, the relative positions of the optical probes 10 and the electric probes 30 with respect to the measurement targets 100 may be adjusted by moving the stage 65 in the X-axis direction, the Y-axis direction, and the Z-axis direction, while the positions of the optical probe head 61 and the electric probe head 63 are fixed. The alignment of the optical probes 10 and the electric probes 30 with respect to the measurement targets 100 thus can be made by various kinds of adjustment methods.

The measurement system 1 illustrated in FIG. 4 causes the electric probes 30 to apply the electric signals to the electric signal terminals of the measurement targets 100 provided on the semiconductor substrate 300. The optical semiconductor elements of the measurement targets 100 driven in response to the electric signals output optical signals L, and the output optical signals L are then received by the optical probes 10.

The example of the method of measuring the measurement targets 100 by use of the measurement system 1 illustrated in FIG. 4 is described in detail below. First, the alignment of the optical probes 10 and the electric probes 30 with respect to the measurement targets 100 is made by the method described above. In particular, the alignment between the measurement targets 100 and the optical probes 10 is made so that the optical semiconductor elements 110 of the measurement targets 100 and the optical probes 10 are optically connected in an optimal state. For example, the output from the photoelectric conversion module 22 to which the optical signals are input from the optical probes 101 and 10*n* at both ends of the optical probe array 12 is monitored while the relative positions between the optical probes 10 and the measurement targets 100 are slightly adjusted. The optical probes 10 and the measurement targets 100 are then fixed at the position at which the strongest optical signals are input to the optical probes 101 and 10*n* at the both ends.

During the above alignment, the optical signals output from the measurement targets 100 are monitored while the electric signals are supplied to the measurement targets 100 from the electric probes 30. When the optical probe array 12 and the electric probe array 32 have the integrated structure, the electric probes 30 in contact with the electric signal terminals of the measurement objects 100 are moved in the X-axis direction, the Y-axis direction, and the Z-axis direction. In view of this, the electric probes 30 are used that still can supply the electric signals to the electric signal terminals with no change in the contact state with the electric signal terminals while the electric probes 30 in contact with the electric signal terminals are moved by about ±15 μm. The electric probes 30 used thus preferably have deformable and elastic strain characteristics. For example, a cantilever type or a vertical type having strong resistance to strain deformation is used for the electric probes 30.

The alignment allows each of the optical probes 10 included in the optical probe array 12 to be simultaneously and optically connected to each of the measurement targets 100. The measurement of the measurement targets 100 in this state is then made as follows.

First, the control circuit 50 matches the operation of the optical signal selectors 21 of the optical circuit unit 20 with the operation of the driver circuits 41 of the electric circuit unit 40. For example, the control circuit 50 sets the optical signal selectors 21 so as to output the optical signals input from the first channels. The control circuit 50 also sets the driver circuits 41 so as to supply the electric signals to the electric probes 30 each implementing the probe unit together with the corresponding optical probes 10 connected to the first channels of the optical signal selectors 21.

The electric signals supplied from the driver circuits 41 are input via the electric probes 30 to drive the measurement targets 100. The optical signals output from the driven measurement targets 100 are input to the optical signal selectors 21 via the optical probes 10. The optical signals output from the m-number of the measurement targets 100 are thus input to the first channels of the m-number of the optical signal selectors 21. The m-number of the optical signals output from the optical signal selectors 21 are then photoelectrically converted by the photoelectric conversion module 22. The photoelectric conversion module 22 sequentially outputs the m-number of the photoelectrically converted electric signals in accordance with the control by the control circuit 50. The electric signals output from the photoelectric conversion module 22 are transmitted to the data processing device 51. For example, conversion electric values of the optical signals are serial processed after AD conversion.

The control circuit 50 then controls the m-number of the optical signal selectors 21 to switch the optical signal selection so as to output the optical signals input from the second channels. The control circuit 50 also controls to set the m-number of the driver circuits 41 so as to supply the electric signals to the electric probes 30 each implementing the probe unit together with the corresponding optical probes 10 connected to the second channels. The control circuit 50 subjects the optical signals input to the second channels of the optical signal selectors 21 to the processing as in the case of the optical signals input to the first channels described above. The control circuit 50 repeats the same processing from the optical signals output from the optical probes 10 connected to the third channels to the optical signals output from the optical probes 10 connected to the n-th channels while controlling the operations of the optical signal selectors 21 and the driver circuits 41.

As described above, the measurement system 1 makes the measurement of the measurement targets 100 while switching the input channels from the first channels to the n-th channels selected by the optical signal selectors 211 to 21*m*. Namely, the control circuit 50 matches the operation of the driver circuits 41 and the operation of the optical signal selectors 21, and repeats causing the optical signal selectors 21 to output the optical signals output from the measurement targets 100 to which the electric signals are supplied from the driver circuits 41.

Figure 6:
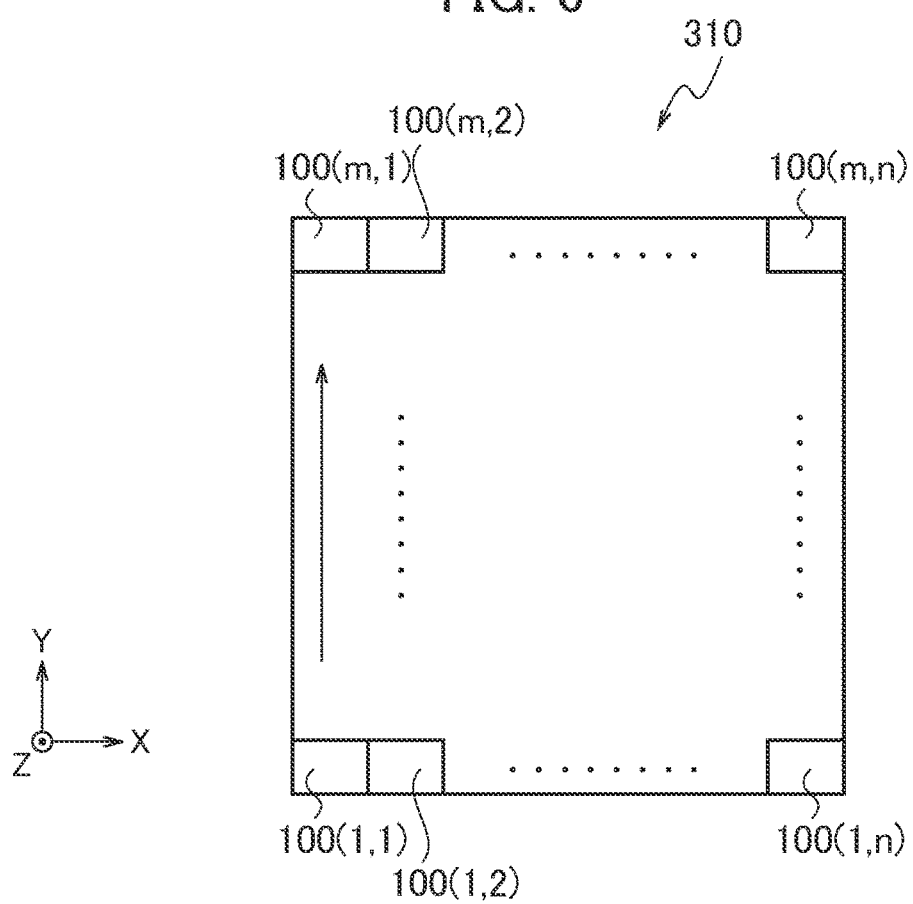
FIG. 6 is a schematic plan view showing a measurement range of a semiconductor substrate.

The measurement of the measurement targets 100 are thus executed in a measurement range 310 of the semiconductor substrate 300 including the "m×n" number of the measurement targets 100, as illustrated in FIG. 6. FIG. 6 indicates the measurement targets 100 each as a measurement target 100(*a, b*) to which the optical probe 10 included in the optical probe group 11*a* and connected to the b-th channel of the optical signal selector 21*a* is optically connected (1≤a≤m, 1≤b≤n). As indicated by the arrow in FIG. 6, the optical signals input to the first channels are processed from the measurement target 100(1, 1) to the measurement target 100(*m*, 1). The optical signals input to the second channels are then processed from the measurement target 100(1, 2) to the measurement target 100(*m*, 2). This process is repeated until the completion of processing the optical signals input to the n-th channels from the measurement target 100(1, *n*) to the measurement target 100 (*m, n*). The "m×n" number of the measurement targets 100 thus can be continuously measured with no additional alignment of the optical probes 10 and the electric probes 30 with the measurement targets 100.

The measurement of the measurement targets 100 is subsequently made in another measurement region 310 while the relative position of the optical probe array 12 and the electrical probe array 32 with respect to the semiconductor substrate 300 on the X-Y plane is shifted. For example, the stage 65 is moved downward in the Z-axis direction, and the optical probe array 12 and the electrical probe array 32 are relatively moved with respect to the semiconductor substrate 300 by a distance of n×Px in the X-axis direction and a distance of m×Py in the Y-axis direction. The stage 65 is then moved upward in the Z-axis direction to a predetermined position at which the semiconductor elements of the measurement targets 100 are optically connected to the optical probes 10 in an optimal state. The "m×n" number of the measurement targets 100 are then measured in the new measurement region 310.

The measurement of the measurement targets 100 in the new measurement region 310 is also made by use of the optical signal selectors 21, the driver circuits 41, and the optical conversion module 22 in the same manner as described above. Namely, the switch of the optical signal selection made by the optical signal selectors 21 is repeated until the optical signals output from all of the optical probes 10 included in the optical probe array 12 are selected. The measurement of the measurement targets 100 is repeated while the measurement region 310 is shifted until the measurement of all of the measurement targets 100 formed on the semiconductor substrate 300 is completed.

The contents of the measurement of the measurement targets 100 may be determined as appropriate. For example, when the measurement targets 100 are optical semiconductor elements driven by an input current, the input current supplied from the driver circuits 41 as an electric signal is gradually increased, such as 0.1, 0.2, . . . , 9.9, and 10.0 mA. Using the measurement data thus obtained, a slope efficiency η and a threshold current Ith of the measurement targets 100 can be calculated.

The positions of the respective measurement targets 100 in the semiconductor substrate 300 may be preliminarily numbered as positional information of the measurement targets 100. The measurement data of the measurement targets 100 and the processing data obtained by the processing of the measurement data are then matched with the positions numbered so as to be stored in a predetermined storage region of the data processing device 51. Examples of methods of numbering the measurement targets 100 in the semiconductor substrate 300 include a method of processing an image on the main surface of the semiconductor substrate 300 using an imaging device such as a camera so as to set the number, and a method of referring to layout information of the measurement targets 100 in the semiconductor substrate 300 so as to set the number. Examples of the main processing data include an output of the optical signal from the respective measurement targets 100 corresponding to the input current (referred to below as an "optical output"), a resistance value, a peak wavelength at an input rated current, and a full width at half maximum (FWHM) of a spectrum.

The optical output of the respective measurement targets 100 is obtained from an output current value in which the optical signal is photoelectrically converted by the photoelectric conversion module 22. The output current value is converted into the optical output in the following manner, for example.

First, an optical semiconductor element used as a reference (referred to below as a "reference device") is prepared. A space optical output of the reference device is measured with a reference optical power meter. The reference device is then driven by the measurement system 1 under the same reference condition as the measurement upon the use of the reference optical power meter, and the output current value of the reference device is measured by the photoelectric conversion module 22. The relation between the optical output of the reference device obtained by the reference optical power meter and the output current value of the reference device obtained by the photoelectric conversion module 22 is thus preliminarily searched. Measuring the reference device under some measurement conditions can set a correlation between the optical output obtained by the reference optical power meter and the output current value obtained by the measurement system 1.

Figure 7:
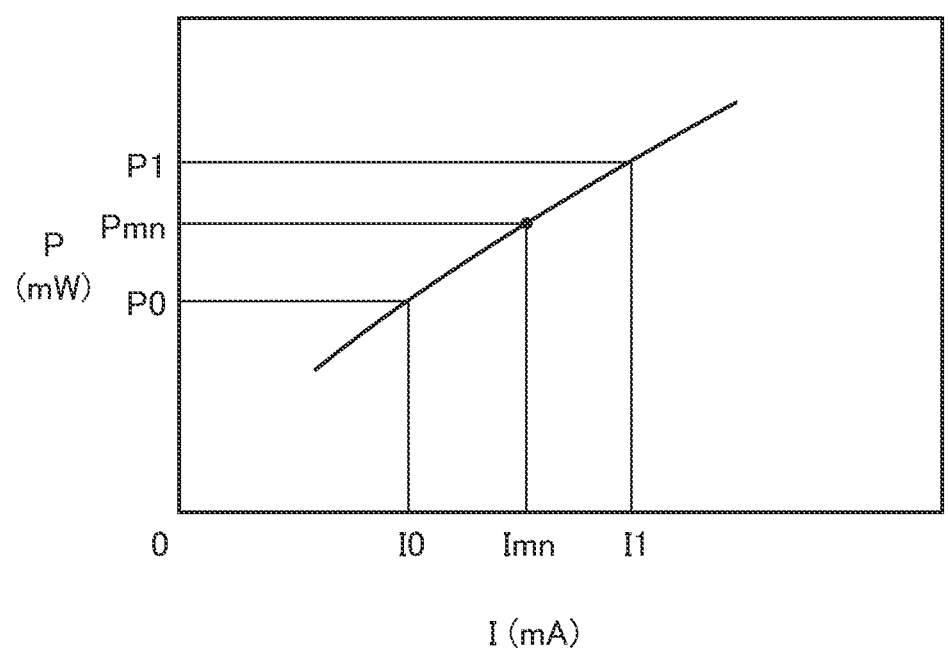
FIG. 7 is a graph for explaining a method of calculating an optical output.

FIG. 7 is an example of plotting the correlation between the optical output and the output current value. The axis of ordinates in FIG. 7 indicates the optical output P measured by the reference optical power meter, and the axis of abscissas indicates the output current value I obtained through the measurement by the measurement system 1. FIG. 7 is the graph in which the optical output P0 corresponding to the output current value I0 and the optical output P1 corresponding to the output current value I1 obtained through the measurement of the reference device are plotted. These two plotted values are subjected to Lagrange interpolation, so as to convert the output current value Imn into the optical output Pmn according to the following formula:

$$Pmn=(Imn-I1)\times P0/(I0-I1)+(Imn-I0)\times P1/(I1-I0) \quad (1)$$

where Imn is the output current value of the measurement target 100, and Pmn is the optical output obtained by the conversion of the output current value Imn, wherein $I1 \geq Imn > I0$.

Preliminarily setting the correlation regarding all of the optical probes 10 used in the optical probe array 12 facilitates the conversion of the output current value of the respective measurement targets 100 into the optical output.

As described above, the measurement system 1 according to the first embodiment uses the optical probe array 12 including the "m×n" number of the optical probes 10 and the electric probe array 32 including the "m×n" number of the electric probes 30 so as to simultaneously make an alignment of the "m×n" number of the measurement targets 100. The measurement system 1 can greatly reduce the time required for the alignment as compared with a case of making an alignment of the respective measurement targets 100 individually with the optical probes 10 and the electric probes 30.

The measurement system 1 causes the respective driver circuits 41 to select the electric probes 30 for supplying the electric signals and causes the respective optical signal selectors 21 to select the optical probes 10 for transmitting the optical signals, so as to select the optical signals processed by the photoelectric conversion module 22. The respective optical signal selectors 21 sequentially select and output the optical signal from the m-number of the optical signals to be input. The photoelectric conversion module 22 sequentially outputs the m-number of the electric signals converted from the optical signals output from the optical signal selectors 21. The respective optical signal selectors 21 repeat the sequential selection of each optical signal from the m-number of the optical signals n-times. This processing can process all of the optical signals output from the "n×m" number of the measurement targets 100.

The time for switching the electric signals by the photoelectric conversion module 22 is quite short as compared with the time for switching the optical signals by the respective optical signal selectors 21 by use of the optical switches and the like. The photoelectric conversion of the m-number of the optical signals and the output of the electric signals by the photoelectric conversion module 22 are thus presumed to be made substantially simultaneously.

Alternatively, an optical-switch two-step configuration may be presumed which uses optical switches stepwise for switching the optical signals n-times and switching the optical signals m-times with regard to the optical signals output from the optical probe array 12 including the "m×n" number of the optical probes 10. The time required for switching the optical signals by the optical switches is much longer than the time for switching the electric signals. The time for switching the electric signals is as short as a level that can be ignored as compared with the time for switching the optical signals. The measurement system 1, which executes the switch of the optical signals only once, takes the measurement time which is about one m-th (1/m), and is thus shorter than the optical-switch two-step configuration. The measurement system 1 thus can save the measurement time.

As described above, the measurement system 1 repeats the measurement of the measurement targets 100 while shifting the measurement range 310, so as to measure all of the measurement targets 100 formed on the semiconductor substrate 300 in a short time. The measurement system 1 thus can determine whether each of the measurement targets 100 is well-made or defective, so as to improve the yield on products including the measurement targets 100 accordingly.

The measurement system 1 uses the single photoelectric conversion module 22 so as to process the optical signals from the plural measurement targets 100 while switching the setting of the optical signal selectors 21 and the driver circuits 41. The measurement system 1 thus does not need to prepare the photoelectric converter or the driver circuit for each of the optical probes 10 or the electric probes 30 when a large number of the measurement targets 100 are simultaneously measured by use of the plural optical probes 10. For example, the number of the photoelectric converters can be decreased to one n-th (1/n) as compared with the case of preparing the photoelectric converter for each of the optical probes 10. The measurement system 1 thus contributes to a reduction in measurement cost and measurement space.

The measurement system 1 also facilitates the increase in the number of the optical probes 10 and the electric probes 30 to be used. For example, when the number of each of the optical probe groups 11 and the electric probe groups 31 is increased to the (m+1) number, the number of each of the optical signal selectors 21 and the number of the driver circuits 41 are only required to be increased to the (m+1) number. Similarly, when the number of the optical probes 10 of the respective optical probe groups 11 and the number of the electric probes 30 of the respective electric probe groups 31 are each increased to the (n+1) number, the number of the input channels of the respective optical signal selectors 21 and the number of the output terminals of the respective driver circuits 41 are only required to be increased to the (n+1) number.

When the increase in the number of each of the optical probes 10 and the electric probes 30 is preliminarily presumed, the optical signal selectors 21 including a large number of the input channels and the driver circuits 41 including a large number of the output terminals are preferably preliminarily prepared. This can easily deal with the later increase in the number of each of the optical probes 10 and the electric probes 30.

Second Embodiment

Figure 8:
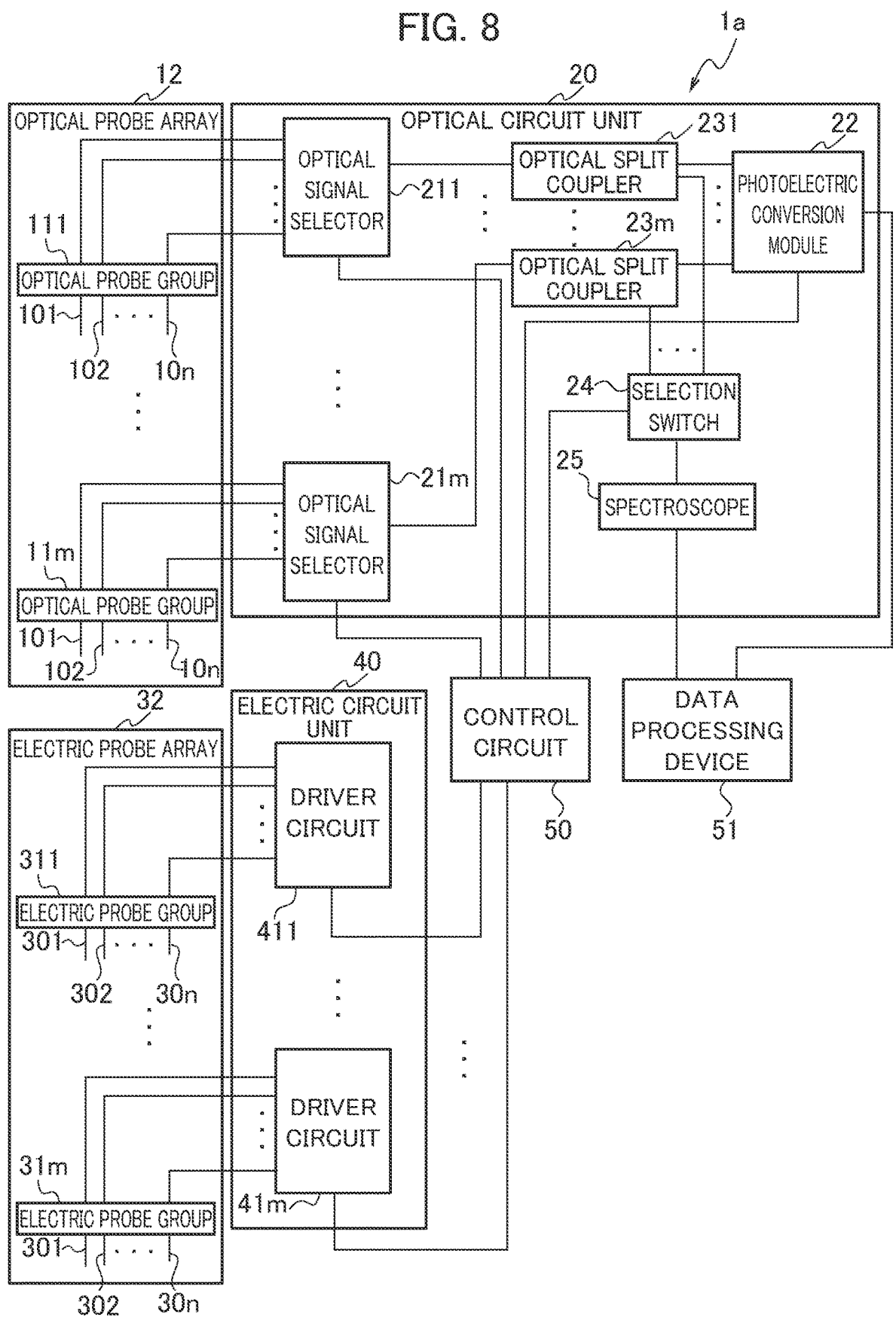
FIG. 8 is a schematic view showing a configuration of a measurement system according to a second embodiment.

A measurement system 1a according to a second embodiment of the present invention has a configuration, as illustrated in FIG. 8, in which the optical circuit unit 20 includes an optical split coupler 231 to an optical split coupler 23m for splitting the optical signals output from the respective optical signal selectors 211 to 21m. The optical split couplers 231 to t 23m are herein also collectively referred to below as "optical signal couplers 23". The measurement system 1a illustrated in FIG. 8 further includes a selection switch 24 to which one of the split optical signals output from the respective optical signal couplers 23 is input, and a spectroscope 25 to which the optical signal output from the selection switch 24 is input. The measurement system 1a thus differs from the measurement system 1 illustrated in FIG. 1 in further including the selection switch 24 and the spectroscope 25.

Each of the m-number of the optical split couplers 23 corresponds to one of the optical signal selectors 21. Each optical split coupler 23 splits the optical signal output from the corresponding optical signal selector 21 into a first optical signal and a second optical signal. For example, the optical split coupler $23i$ corresponding to the optical signal selector $21i$ splits the optical signal output from the optical signal selector $21i$ into the first optical signal and the second optical signal ($1 \le i \le m$).

The selection switch 24 selects and outputs one of the first optical signals output from the m-number of the optical split couplers 23. The control circuit 50 controls the operation of the selection switch 24. The control circuit 50 controls the selection signal 24 to output one of the first optical signals output from the optical split couplers 231 to 23m. The selection of the first optical signals by the selection switch 24 is made every time the selection of the optical signals made by the respective optical signal selectors 21 is switched from the first channel to the n-th channel.

The spectroscope 25 resolves the first optical signals output from the selection switch 24. For example, the spectroscope 25 that has the properties of a resolution of 1 nm or less and an accumulated time of an image sensor of several milliseconds (msec), is effective for the measurement with a high accuracy in a short time.

The measurement system 1a illustrated in FIG. 8 is configured such that the photoelectric conversion module 22 converts the second optical signals output from the m-number of the optical split couplers 23 into the electric signals, and selects and outputs one of the converted electric signals, in the same manner as the method described with reference to FIG. 4. The electric signal output from the photoelectric conversion module 22 is then subjected to predetermined processing. For example, the optical output of the respective measurement objects 100 is calculated according to the correlation between the output current value I and the optical output P as illustrated in FIG. 7.

As described above, the measurement system 1a according to the second embodiment causes the optical split couplers 23 to split the optical signals output from the optical signal selectors 21. The spectroscopy of the optical signals by the spectroscope 25 is executed simultaneously with the processing of the electric signals converted by the photoelectric conversion module 22. The measurement system 1a illustrated in FIG. 8 thus can simultaneously execute both the measurement of the optical output of the respective measurement targets 100 and the measurement of the spectroscopy while achieving a reduction in the measurement time.

The measurement system 1a does not need to prepare the photoelectric converter or the spectroscope for each of the optical probes 10. The number of the photoelectric converters can be reduced to one n-th (1/n), and the number of the spectroscopes can be reduced to one (m×n)-th (1/(m×n)), as compared with a case of preparing the photoelectric converter and the spectroscope for each of the optical probes 10. The measurement system 1a thus contributes to a reduction in measurement cost and measurement space.

The measurement system 1a can reduce the measurement time including the photoelectric conversion made by the photoelectric conversion module 22 to about one m-th (1/m) as compared with the optical-switch two-step configuration, as in the case of the first embodiment. The measurement time by use of the spectroscope 25 is about one half as compared with the optical-switch two-step configuration. The measurement system 1a thus can reduce the measurement time.

While this embodiment is illustrated above with the case in which each of the optical split couplers 23 splits the optical signal output from the respective optical signal selectors 21 into two optical signals, the optical signal output from the respective optical selectors 21 may be split into three or more optical signals. For example, a waveform of the respective optical signals may be monitored in parallel to the measurement of the optical output and the measurement of the spectroscopy.

Modified Example

Figure 9:
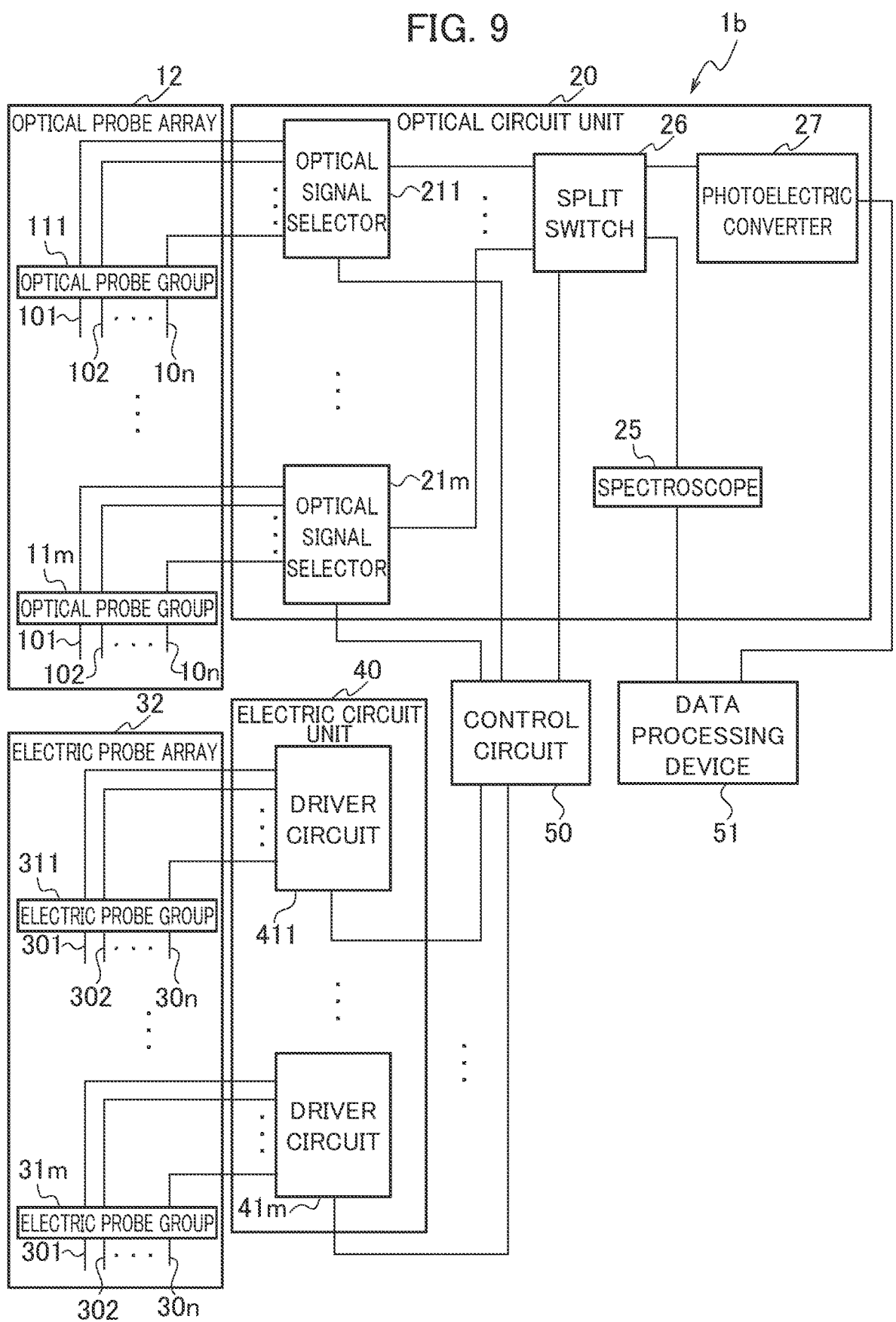
FIG. 9 is a schematic view showing a configuration of a measurement system according to a modified example of the second embodiment.

FIG. 9 illustrates a measurement system 1b according to a modified example of the second embodiment. The measurement system 1b uses a split switch 26 instead of the optical split couplers 23 and the selection switch 24 of the measurement system 1a. The split switch 26 selects one of the optical signals output from the m-number of the optical signal selectors 21, and splits the optical signal selected by a coupling function into the first optical signal and the second optical signal. The spectroscope 25 resolves the first optical signal output from the split switch 26. The second optical signal output from the split switch 26 is converted into the electric signal by a photoelectric converter 27. The second optical signal to be split toward the photoelectric converter 27 is typically set to be greater, and the first optical signal to be split toward the spectroscope 25 is typically set to be smaller.

The split switch 26 used is an optical switch including the m-number of input channels, for example. The control circuit 50 controls the operation of the split switch 26. The control of the control circuit 50 selects one of the optical signals output from the optical signal selectors 211 to 21m. The split switch 26 splits the selected optical signal into the first optical signal and the second optical signal, and outputs the split optical signal. The split switch 26 sequentially outputs the m-number of the first optical signals and the second optical signals by the control of the control circuit 50.

As described above, the measurement system 1b differs from the measurement system 1a illustrated in FIG. 8 in causing the split switch 26 to split the optical signals instead of the optical split couplers 23. The measurement system 1b sequentially splits the optical signals output from the m-number of the optical probes 10 through the switching made by the split switch 26, so as to input the split optical signals to each of the photoelectric converter 27 and the spectroscope 25. The measurement system 1b thus can simultaneously measure the output characteristics and the spectroscopic characteristics of the measurement targets 100, for example.

The following are explanations of the comparison of the measurement time between the measurement system 1, the measurement system 1a, and the measurement system 1b when the optical switches are used as the optical signal selectors 21, the selection switch 24, and the split switch 26 of the optical circuit unit 20. The switching time ts of the optical switches used for the optical circuit unit 20 is typically set to several milliseconds to several tens of milliseconds. The switching time td of the driver circuits 41 for switching the electric signals is several nanoseconds to several microseconds. Namely, the relation of ts»td is satisfied, and the measurement time of the respective measurement targets 100 substantially depends on the switching time ts of the optical switches and the processing time tm for the photoelectric conversion.

The measurement time Tp1 of the measurement system 1 illustrated in FIG. 1 is represented by Tp1=(m×n)×(ts+tm). The measurement time Tp2 of the measurement system 1a illustrated in FIG. 8 is represented by Tp2=(m×n)×(ts+tm)+m×(ts+tm2), where tm2 is the processing time of the optical signals by the spectroscope 25. The measurement time Tp3 of the measurement system 1b illustrated in FIG. 9 is represented by Tp3=(m×n)×(ts+tm+tm2).

Figure 10:
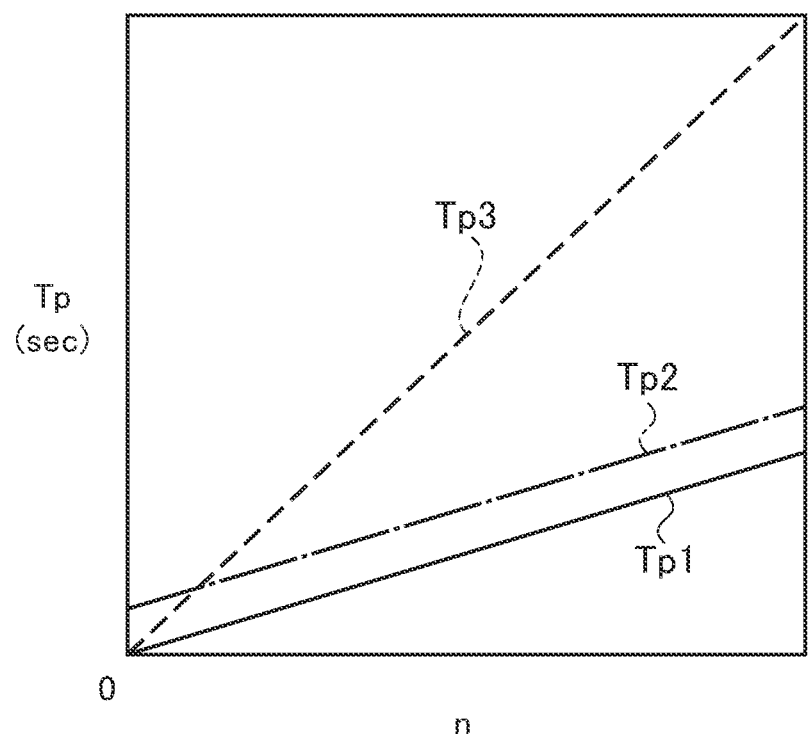
FIG. 10 is a graph showing a measurement time of a measurement system according to one embodiment.

FIG. 10 illustrates the measurement time for measuring the "m×n" number of the measurement targets 100 by use of each of the measurement system 1, the measurement system 1a, and the measurement system 1b. The axis of abscissas in FIG. 10 indicates the n-number of switching times of the optical switches, and the axis of ordinates indicates the measurement time Tp. As illustrated in FIG. 10, the measurement time Tp3 of the measurement system 1b is longer than the measurement time Tp1 of the measurement system 1 or the measurement time Tp2 of the measurement system 1a. This is because the measurement system 1b switches the split switch 26 m-times for each input channel selected by the switching made by the optical signal selectors 21. Namely, the measurement system 1b increases the switching time of the optical signals by the optical switches by m-times as compared with the measurement system 1 and the measurement system 1a, so as to increase the measurement time corresponding to the increase in the number of switching the optical signals.

For example, when m=4, n=12, ts=40 (msec), tm=100 (msec), and tm2=1000 (msec), Tp1 results in 6720 (msec), Tp2 results in 10880 (msec), and Tp3 results in 54720 (msec).

The reason the measurement time of the spectroscope 25 to measure the spectroscopic characteristics is long is that the accumulated time of the image sensor used for the light-receiving unit of the spectroscope 25 is set to be long to some extent so as to obtain an optimal output value of measurement accuracy for each wavelength. For example, the time required for 48 measurement targets 100 is about 6.7 seconds for the measurement system 1 illustrated in FIG. 1. The time is about 11 seconds for the measurement system 1a including the spectroscope 25 illustrated in FIG. 8. The time is about 55 seconds for the measurement system 1b illustrated in FIG. 9. The time of the measurement made by the measurement system 1a when including the measurement made by the spectroscope 25 is about one fifth of the time of the measurement made by the measurement system 1b.

As described above, the measurement system 1 and the measurement system 1a particularly can greatly reduce the measurement time for the plural measurement targets formed on the semiconductor substrate 300. The reduction in the switching time ts of the optical switches and the processing time tm of the optical signals are effective for the further reduction in the measurement time. When the spectroscopic characteristics are also measured, a reduction in the processing time tm2 by the optimization of the accumulated time of the image sensor of the spectroscope 25 is effective for the reduction in the measurement time.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

While the above embodiments have been illustrated with the case of implementing the optical probe array 12 such that the m-number of the optical probe groups 11 each including the n-core fibers are aligned, the optical probe array 12 may be implemented such that the n-number of the optical probe groups 11 each including the m-core fibers are aligned. The optical signal selectors 21 may use optical devices instead of the optical switches. For example, an optical coupler may be used as a mixer in the respective optical signal selectors 21.

The above embodiments have been illustrated with the case in which the probe unit includes the single optical probe 10 and the single electric probe 30. The number of the optical probe 10 and the electric probe 30 included in the probe unit is not limited to one. For example, the single optical probe 10 and the two electric probes 30 may be used to implement the probe unit.

As described above, it is natural that the present invention incorporates a variety of embodiments which are not described herein.

What is claimed is:

1. A measurement system for measuring measurement targets, the system comprising:
    an optical probe array including an m-number of optical probe groups arranged, each including an n-number of optical probes, where n and m are each an integer of two or greater;
    an m-number of optical signal selectors, each signal selector comprising an optical switch including n-number of optical input channels, and each signal selector optically coupled and corresponding to one of the optical probe groups to simultaneously receive a plurality of optical signals provided by the n-number of the optical probes of the corresponding optical probe group, and to select and output one of the optical signals provided by the n-number of the optical probes of the corresponding optical probe groups, wherein each optical signal selector is connected to its corresponding optical probes via optical signal transfer input paths, and wherein each optical signal selector comprises an optical output terminal connected to a respective optical signal transfer output path, such that the system includes m-number of optical signal transfer output paths;
    an m-number of optical split couplers each corresponding to one of the optical signal selectors, and configured to split each of the optical signals output from the corresponding optical signal selectors into a first optical signal and a second optical signal, resulting in m-number of first optical signals and m-number of second optical signals;
    a selection switch optically coupled to the m-number of optical split couplers to receive the m-number of first optical signals, wherein the control circuit controls operation of the selection switch such that the selection switch is configured to select and output one of the m-number of first optical signals provided by the m-number of the optical split couplers;
    a spectroscope configured to resolve the selected first optical signal output from the selection switch; and
    a control circuit configured to control switching behavior of the optical signal selectors;
    wherein each of the n-number of the optical probes is simultaneously and optically connected to each of the measurement targets to simultaneously provide the plurality of optical signals to its corresponding optical signal selector; and
    wherein the control circuit controls the optical signal selectors to repeat a selection of the optical signals until the optical signals output from all of the optical probes included in the respective optical probe groups are selected.

2. The measurement system according to claim 1, further comprising:
    an m-number of electric probe groups each corresponding to one of the optical probe groups, and including electric probes each being paired with one of the optical probes in the corresponding optical probe groups; and
    an m-number of driver circuits each corresponding to one of the electric probe groups, and configured to supply electric signals to the electric probes of the corresponding electric probe groups,
    wherein the optical probes receive optical signals output from the measurement targets in response to the electric signals input to the measurement targets via the electric probes.

3. The measurement system according to claim 2, wherein the control circuit matches an operation of the respective driver circuits and an operation of the respective optical signal selectors to cause the optical signal selectors to output the optical signals emitted by the measurement targets to which the driver circuits supply the electric signals.

4. The measurement system according to claim 1, further comprising a photoelectric conversion module configured to convert the second optical signals provided by the m-number of the optical split couplers into electric signals, and select and output one of the converted electric signals.

* * * * *